US010128173B2

(12) United States Patent
Cho

(10) Patent No.: US 10,128,173 B2
(45) Date of Patent: Nov. 13, 2018

(54) COMMON CONTACT LEADFRAME FOR MULTIPHASE APPLICATIONS

(71) Applicant: Infineon Technologies Americas Corp., El Segundo, CA (US)

(72) Inventor: Eung San Cho, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/287,368

(22) Filed: Oct. 6, 2016

(65) Prior Publication Data
US 2018/0102307 A1    Apr. 12, 2018

(51) Int. Cl.
*H01L 23/495* (2006.01)
*H01L 21/48* (2006.01)
(Continued)

(52) U.S. Cl.
CPC .... *H01L 23/49562* (2013.01); *H01L 21/4825* (2013.01); *H01L 21/565* (2013.01); *H01L 22/20* (2013.01); *H01L 23/3114* (2013.01); *H01L 23/49503* (2013.01); *H01L 23/49548* (2013.01); *H01L 23/49568* (2013.01); *H01L 23/49575* (2013.01); *H01L 24/37* (2013.01); *H01L 24/45* (2013.01); *H02M 3/158* (2013.01);
(Continued)

(58) Field of Classification Search
None
See application file for complete search history.

(56) References Cited

U.S. PATENT DOCUMENTS

| 6,680,593 | B2 | 1/2004 | Gotou |
| 7,173,333 | B2 | 2/2007 | Hata et al. |

(Continued)

FOREIGN PATENT DOCUMENTS

| CN | 102569361 A | 7/2012 |
| CN | 102915987 A | 2/2013 |

(Continued)

OTHER PUBLICATIONS

International Rectifier, "IRDM982 Series—IRDM982-025MB, IRDM982-035MB Complete Motion Controller Module for PM AC fan", Apr. 8, 2015, 27 pp.

(Continued)

*Primary Examiner* — Calvin Choi
(74) *Attorney, Agent, or Firm* — Shumaker & Sieffert, P.A.

(57) ABSTRACT

In some examples, a device includes an input leadframe segment and a reference leadframe segment that is electrically isolated from the input leadframe segment. The device further includes at least four transistors comprising at least two high-side transistors that are electrically connected to the input leadframe segment and at least two low-side transistors that are electrically connected to the reference leadframe segment. The device further includes at least two switching elements, wherein each switching element of the at least two switching elements is electrically connected to a respective high-side transistor of the at least two high-side transistors, each switching element of the at least two switching elements is electrically connected to a respective low-side transistor of the at least two low-side transistors, and the at least four transistors include at least one discrete transistor.

20 Claims, 7 Drawing Sheets

(51) Int. Cl.
*H01L 21/56* (2006.01)
*H01L 21/66* (2006.01)
*H01L 23/31* (2006.01)
*H01L 23/00* (2006.01)
*H02M 3/158* (2006.01)
*H02M 7/00* (2006.01)
*H02M 7/217* (2006.01)

(52) U.S. Cl.
CPC ......... *H02M 7/003* (2013.01); *H02M 7/2173* (2013.01); *H01L 2224/37012* (2013.01); *H01L 2224/37147* (2013.01); *H01L 2224/45014* (2013.01); *H01L 2224/45124* (2013.01)

(56) References Cited

U.S. PATENT DOCUMENTS

| | | | |
|---|---|---|---|
| 7,342,378 B2 | 3/2008 | Sakamoto et al. | |
| 7,348,687 B2 | 3/2008 | Aichriedler et al. | |
| 7,449,778 B2 | 11/2008 | Sander | |
| 7,589,400 B2 | 9/2009 | Hozoji et al. | |
| 7,880,280 B2 | 2/2011 | Otremba | |
| 7,943,955 B2 | 5/2011 | Haeberlen et al. | |
| 8,018,189 B2 | 9/2011 | Narumi et al. | |
| 8,138,585 B2 | 3/2012 | Liu et al. | |
| 8,258,732 B2 | 9/2012 | Iwaji et al. | |
| 8,488,316 B2 | 7/2013 | Zeng et al. | |
| 8,674,636 B2 | 3/2014 | Matsuo et al. | |
| 8,704,269 B2 | 4/2014 | Macheiner et al. | |
| 9,087,829 B2 | 7/2015 | Macheiner et al. | |
| 9,257,907 B2 | 2/2016 | Nomiyama et al. | |
| 9,324,851 B2* | 4/2016 | Nega | H01L 29/41758 |
| 2005/0127755 A1* | 6/2005 | Aichriedler | B60R 21/017 |
| | | | 307/10.1 |
| 2006/0071860 A1* | 4/2006 | Hozoji | H01L 24/40 |
| | | | 343/700 MS |
| 2007/0081280 A1* | 4/2007 | Strzalkowski | H01L 27/08 |
| | | | 361/18 |
| 2007/0252265 A1 | 11/2007 | Sander | |
| 2012/0014059 A1 | 1/2012 | Zeng et al. | |
| 2012/0161128 A1 | 6/2012 | Macheiner et al. | |
| 2013/0032855 A1 | 2/2013 | Macheiner et al. | |
| 2013/0049137 A1* | 2/2013 | Uno | H01L 27/088 |
| | | | 257/401 |
| 2015/0145112 A1 | 5/2015 | Otremba | |
| 2015/0380353 A1 | 12/2015 | Bauer et al. | |
| 2016/0172280 A1* | 6/2016 | Ranmuthu | H01L 23/49568 |
| | | | 257/379 |
| 2017/0230017 A1* | 8/2017 | Hori | H03F 3/2171 |

FOREIGN PATENT DOCUMENTS

| | | |
|---|---|---|
| DE | 102006020243 B3 | 1/2008 |
| DE | 102008006835 A1 | 9/2008 |
| DE | 102012213208 A1 | 2/2013 |
| DE | 102014117019 A1 | 5/2015 |
| DE | 102014203899 A1 | 9/2015 |
| WO | 2009154969 A2 | 12/2009 |

OTHER PUBLICATIONS

U.S. Appl. No. 15/469,112, filed by Stefan Macheiner, filed Mar. 24, 2017.
U.S. Appl. No. 15/287,280, filed by Eung San Cho, filed Oct. 6, 2016.
Office Action from U.S. Appl. No. 15/469,112, dated Nov. 15, 2017, 10 pp.
Amendment to Office Action dated Nov. 15, 2017, from U.S. Appl. No. 15/469,112, filed Jan. 31, 2018, 11 pp.
Response to Final Office Action dated Mar. 9, 2018, from U.S. Appl. No. 15/469,112, filed May 3, 2018, 11 pp.
Advisory Action from U.S. Appl. No. 15/469,112, dated Jun. 1, 2018, 3 pp.
Final Office Action from U.S. Appl. No. 15/469,112, dated Mar. 9, 2018, 15 pp.
Notice of Allowance from U.S. Appl. No. 15/469,112, dated Aug. 3, 2018, 7 pp.

\* cited by examiner

COMMON CONTACT LEADFRAME FOR MULTIPHASE APPLICATIONS

TECHNICAL FIELD

This disclosure relates to semiconductor packaging, and more specifically, to semiconductor packages for power electronics.

BACKGROUND

A half-bridge circuit may include two analog devices or switches. Half-bridge circuits may be used in power supplies for motors, in rectifiers, and for power conversion. Each half-bridge circuit package has several contacts and may include several conductive paths to connect the contacts to each other and to external components.

Some circuits may combine two or more half-bridge circuits to create a multiphase power converter. The multiphase power converter may have an output node for each phase of the circuit. Multiphase power converters may be used as direct-current-to-direct-current (DC/DC) converters or alternating-current-to-DC (AC/DC) converters in a variety of applications, such as electronics, automotive, and electric motors, among others.

SUMMARY

This disclosure describes techniques for a multiphase power converter including discrete transistors. Each phase of the multiphase power converter may include two transistors such as a high-side transistor and a low-side transistor. The transistors may include common connections for an input voltage, a reference voltage, and a switch node.

In some examples, a device includes an input leadframe segment and a reference leadframe segment, wherein the reference leadframe segment is electrically isolated from the input leadframe segment. The device further includes at least four transistors comprising at least two high-side transistors, wherein each high-side transistor of the at least two high-side transistors is electrically connected to the input leadframe segment, and at least two low-side transistors, wherein each low-side transistor of the at least two low-side transistors is electrically connected to the reference leadframe segment. The device further includes at least two switching elements, wherein each switching element of the at least two switching elements is electrically connected to a respective high-side transistor of the at least two high-side transistors, each switching element of the at least two switching elements is electrically connected to a respective low-side transistor of the at least two low-side transistors, and the at least four transistors include at least one discrete transistor.

In some examples, a method includes electrically connecting at least two high-side transistors of at least four transistors to an input leadframe segment and electrically connecting at least two low-side transistors of the at least four transistors to a reference leadframe segment, wherein the reference leadframe segment is electrically isolated from the input leadframe segment. The method further includes electrically connecting each respective switching element of at least two switching elements to a respective high-side transistor of the at least two high-side transistors. The method further includes electrically connecting each respective switching element of at least two switching elements to a respective low-side transistor of the at least two low-side transistors, wherein the at least four transistors include at least one discrete transistor.

In some examples, a multiphase power converter includes an input leadframe segment and a reference leadframe segment, wherein the reference leadframe segment is electrically isolated from the input leadframe segment. The multiphase power converter further includes at least four vertical transistors comprising at least two high-side vertical transistors, wherein each high-side vertical transistor of the at least two high-side vertical transistors is electrically connected to the input leadframe segment, and at least two low-side vertical transistors, wherein each low-side vertical transistor of the at least two low-side transistors is electrically connected to the reference leadframe segment. The multiphase power converter further includes at least two switching elements, wherein each switching element of the at least two switching elements is electrically connected to a respective high-side vertical transistor of the at least two high-side vertical transistors, each switching element of the at least two switching elements is electrically connected to a respective low-side vertical transistor of the at least two low-side vertical transistors, and each vertical transistor of the at least four vertical transistors comprises a discrete vertical transistor.

The details of one or more examples are set forth in the accompanying drawings and the description below. Other features, objects, and advantages will be apparent from the description and drawings, and from the claims.

DETAILED DESCRIPTION

Figure 1:
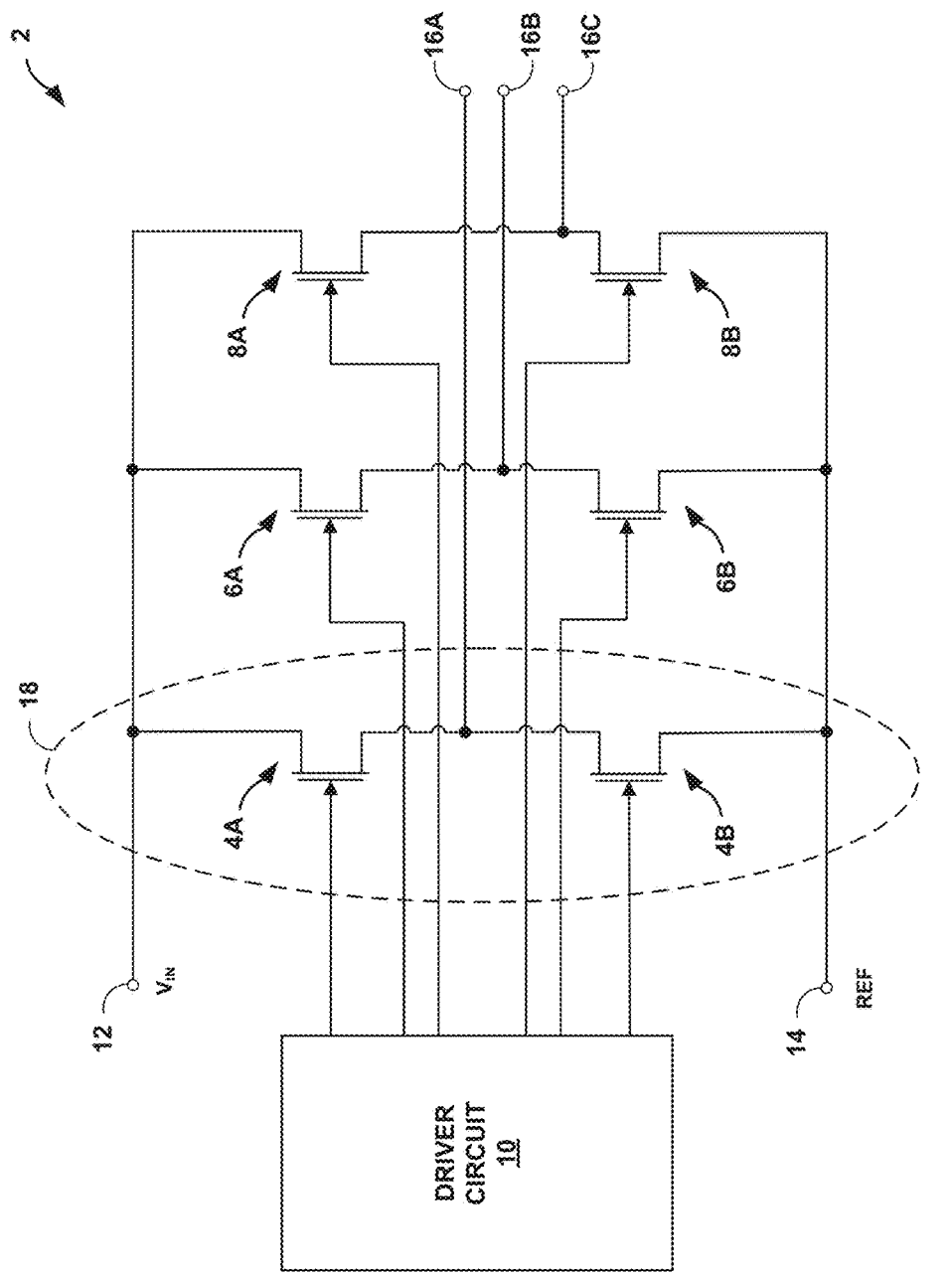
FIG. 1 is a circuit diagram of a multiphase power converter, in accordance with some examples of this disclosure.

FIG. 1 is a circuit diagram of a multiphase power converter, in accordance with some examples of this disclosure. In some examples, device 2 may include a multiphase power converter such as a half-bridge direct-current-to-direct-current (DC/DC) buck converter for converting an input DC signal to an output DC signal with a lower voltage. For each phase, a multiphase power converter may include a half-bridge circuit. As a DC-to-DC buck converter, device 2 may operate as a voltage regulator in a variety of applications. In some examples, device 2 may be designed for high-power applications large amounts of current and high voltages. However, the techniques of this disclosure may apply to other circuits and configurations, such as other power converters, including multiphase power converters and alternating-current-to-DC (AC/DC) power converters.

Device 2 may include transistors 4A, 4B, 6A, 6B, 8A, 8B and driver circuit 10. In some examples, device 2 may contain more or fewer components than depicted in FIG. 1. Device 2 may include input node 12, reference node 14, and output nodes 16A-16C, as well as other nodes not shown in FIG. 1. Nodes 12, 14, and 16A-16C may be configured to connect to external components. For example, input node 12 may connect to an input voltage such as a power supply, reference node 14 may connect to a reference voltage, such as reference ground, and output nodes 16A-16C may connect to a load such as an electronic device. Each output nodes 16A-16C may supply one phase of an output voltage to another device or circuit. In some examples, driver circuit 10 may connect to an external circuit through a node (not shown in FIG. 1).

Transistors 4A, 4B, 6A, 6B, 8A, 8B may include metal-oxide semiconductor (MOS) field-effect transistors (FETs), bipolar junction transistors (BJTs), and/or insulated-gate bipolar transistors (IGBTs). Transistors 4A, 4B, 6A, 6B, 8A, 8B may include n-type transistors or p-type transistors. In some examples, transistors 4A, 4B, 6A, 6B, 8A, 8B may include other analog devices such as diodes. Transistors 4A, 4B, 6A, 6B, 8A, 8B may also include freewheeling diodes connected in parallel with transistors to prevent reverse breakdown of transistors 4A, 4B, 6A, 6B, 8A, 8B. In some examples, transistors 4A, 4B, 6A, 6B, 8A, 8B may operate as switches, as analog devices, and/or power transistors.

Although transistors 4A, 4B, 6A, 6B, 8A, 8B are shown in FIG. 1 as MOSFET symbols, it is contemplated that any electrical device that is controlled by a voltage may be used in place of the MOSFETs as shown. For example, transistors 4A, 4B, 6A, 6B, 8A, 8B may include, but not limited to, any type of field-effect transistor (FET), a bipolar junction transistor (BJT), an insulated-gate bipolar transistor (IGBT), a high-electron-mobility transistor (HEMT), a gallium-nitride (GaN) based transistor, or another element that uses voltage for its control.

Transistors 4A, 4B, 6A, 6B, 8A, 8B may include various material compounds, such as silicon (Si), silicon carbide (SiC), Gallium Nitride (GaN), or any other combination of one or more semiconductor materials. To take advantage of higher power density requirements in some circuits, power converters may operate at higher frequencies. Improvements in magnetics and faster switching, such as Gallium Nitride (GaN) switches, may support higher frequency converters. These higher frequency circuits may require control signals to be sent with more precise timing than for lower frequency circuits.

Driver circuit 10 may deliver signals and/or voltages to the control terminals of transistors 4A, 4B, 6A, 6B, 8A, 8B. Driver circuit 10 may perform other functions. Together, transistors 4A, 4B, 6A, 6B, 8A, 8B and driver circuit 10 may include one or more semiconductor package such as a semiconductor die, chip-embedded substrate, an integrated circuit (IC), or any other suitable package. In some examples, driver circuit 10 may be integrated into the package with one or more of transistors 4A, 4B, 6A, 6B, 8A, 8B, or driver circuit 10 may be a separate IC.

Half-bridge circuit 18 may include transistors 4A, 4B. Transistors 4A, 4B may be coupled to each other and to output node 16A. Half-bridge circuit 18 may produce one phase of an output voltage for device 2. Transistors 6A, 6B and transistor 8A, 8B may each produce other phases of the output voltage for device 2.

In accordance with the techniques of this disclosure, transistors 4A, 4B, 6A, 6B, 8A, 8B may include a discrete transistor. The discrete transistor may be separate from other transistors of transistors 4A, 4B, 6A, 6B, 8A, 8B, i.e., not integrated into a single semiconductor die. In some examples, the discrete transistor may improve heat dissipation of device 2, as compared to an integrated transistor. In some examples, if the discrete transistor is defective, the cost of discarding the semiconductor die with the defective transistor may be less, as compared to a defective integrated transistor inside a semiconductor die with at least one other transistor. If testing reveals a defective integrated transistor, the semiconductor die with two or more transistors may be discarded. In contrast, if testing reveals a defective discrete transistor, only the discrete transistor may be discarded.

Figure 2:
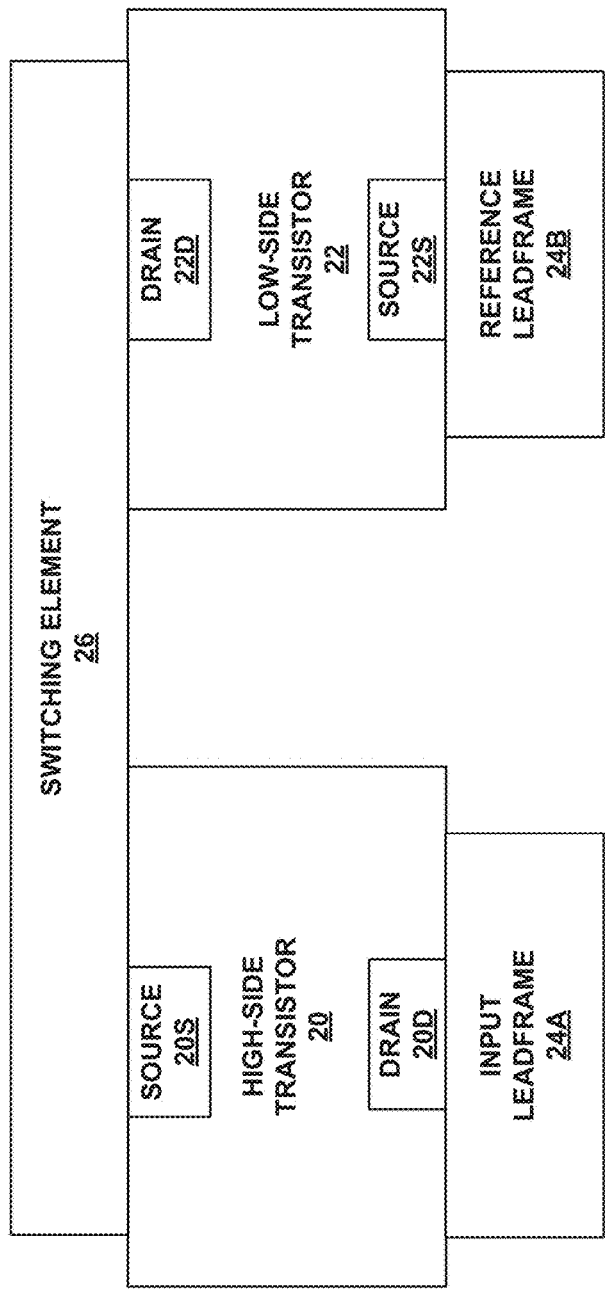
FIG. 2 is a side-view block diagram of a single phase of a multiphase device with two transistors, in accordance with some examples of this disclosure.

FIG. 2 is a side-view block diagram of a single phase of a multiphase device with two transistors 20, 22, in accordance with some examples of this disclosure. One or both of transistors 20, 22 may include vertical transistors that are manufactured from silicon or any other suitable semiconductor. For a vertical transistor, the source terminal and the drain terminal may be on opposite sides or opposite surfaces of the transistor. Current in a vertical transistor may flow through the transistors from top to bottom or from bottom to top.

Transistor 20 may include two load terminals, such as source 20S and a drain 20D. Transistor 22 may include two load terminals, such as source 22S and a drain 22D. Each of transistors 20, 22 may include a control terminal such as a gate terminal (not shown in FIG. 2). Each of the control terminals and load terminals of transistors 20, 22 may include a pad or area at a surface of transistor 20 or transistor 22 to form external electrical connections. High-side transistor 20 may function in a manner similar to transistor 4A in FIG. 1, and low-side transistor 22 may function in a manner similar to transistor 4B in FIG. 1.

Transistors 20, 22 may be configured such that source 20S is electrically connected to drain 22D by switching element 26. Switching element 26, as well as the switching elements of FIGS. 3-11, may include a metallization layer, a clip, a ribbon, a die paddle, a wire bond, and/or any other suitable conductive material. Switching element 26 may be on an opposite side of transistors 20, 22 from drain 20D and source 22S. In some examples, source 20S and drain 22D may be electrically connected through switching element 26 to an inductor (not shown in FIG. 2).

Figure 3:
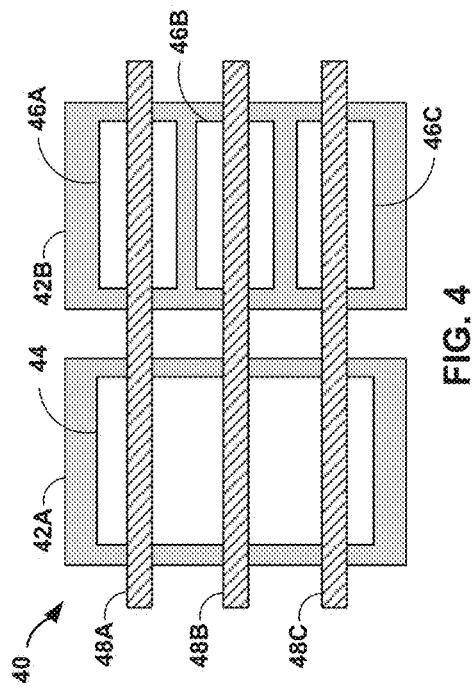
FIG. 3 is a top-view diagram of a device including two semiconductor die electrically connected to two leadframe segments, in accordance with some examples of this disclosure.

FIG. 3 is a top-view diagram of a device 30 including two semiconductor die 34, 36 electrically connected to two die leadframe segments 32A, 32B, in accordance with some examples of this disclosure. Leadframe segments 32A, 32B may include die paddles, metallization layers, and/or any other suitable conductive material. Leadframe segment 32A may be electrically connected to a drain terminal of each high-side transistor in semiconductor die 34. Leadframe segment 32B may be electrically connected to a source terminal of each low-side transistor in semiconductor die 36. Each of conductive elements 38A-38C may include a switch node and/or output element of device 30. The transistors in semiconductor die 34, 36 may be integrated transistors.

Figure 4:
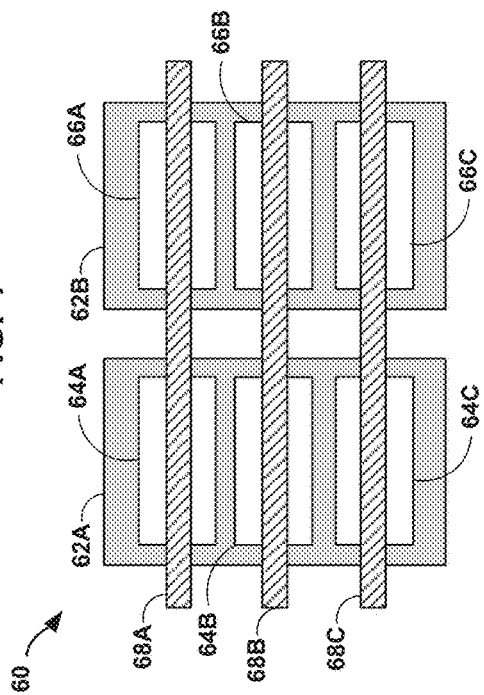
FIG. 4 is a top-view diagram of a device including a semiconductor die and three discrete transistors electrically connected to two leadframe segments, in accordance with some examples of this disclosure.

FIG. 4 is a top-view diagram of a device 40 including a semiconductor die 44 and three discrete transistors 46A-46C electrically connected to two leadframe segments 42A, 42B, in accordance with some examples of this disclosure. The high-side transistors in semiconductor die 44 may be integrated transistors. Low-side transistors 46A-46C may be discrete transistors, where each of low-side transistor 46A-46C includes a separate semiconductor die.

Figure 5:
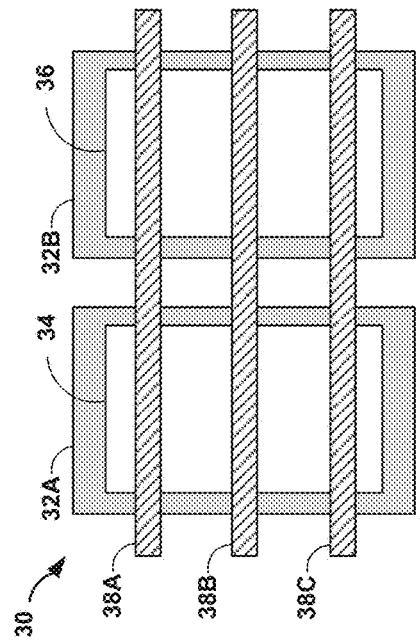
FIG. 5 is a top-view diagram of a device including a semiconductor die and three discrete transistors electrically connected to two leadframe segments, in accordance with some examples of this disclosure.

FIG. 5 is a top-view diagram of a device 50 including a semiconductor die 56 and three discrete transistors 54A-54C electrically connected to two leadframe segments 52A, 52B, in accordance with some examples of this disclosure. High-side transistors 54A-54C may be discrete transistors, where each of high-side transistor 54A-54C includes a separate semiconductor die. The low-side transistors in semiconductor die 56 may be integrated transistors.

Figure 6:
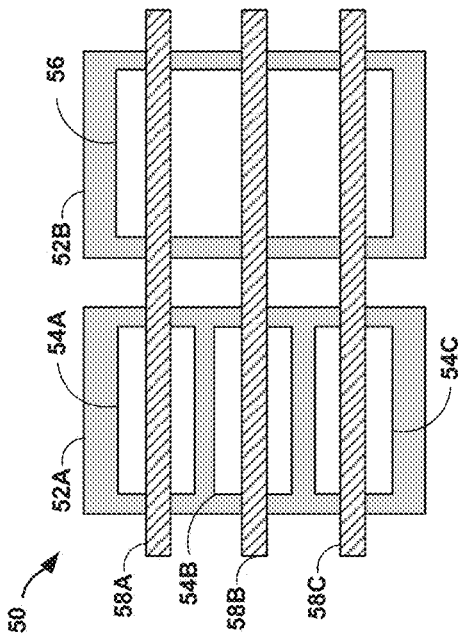
FIG. 6 is a top-view diagram of a device including six discrete transistors electrically connected to two leadframe segments, in accordance with some examples of this disclosure.

FIG. 6 is a top-view diagram of a device 60 including six discrete transistors 64A-64C, 66A-66C electrically connected to two leadframe segments 62A, 62B, in accordance with some examples of this disclosure. High-side transistors 64A-64C and low-side transistors 66A-66C may be discrete transistors, where each of high-side transistor 64A-64C, 66A-66C includes a separate semiconductor die.

Figure 7:
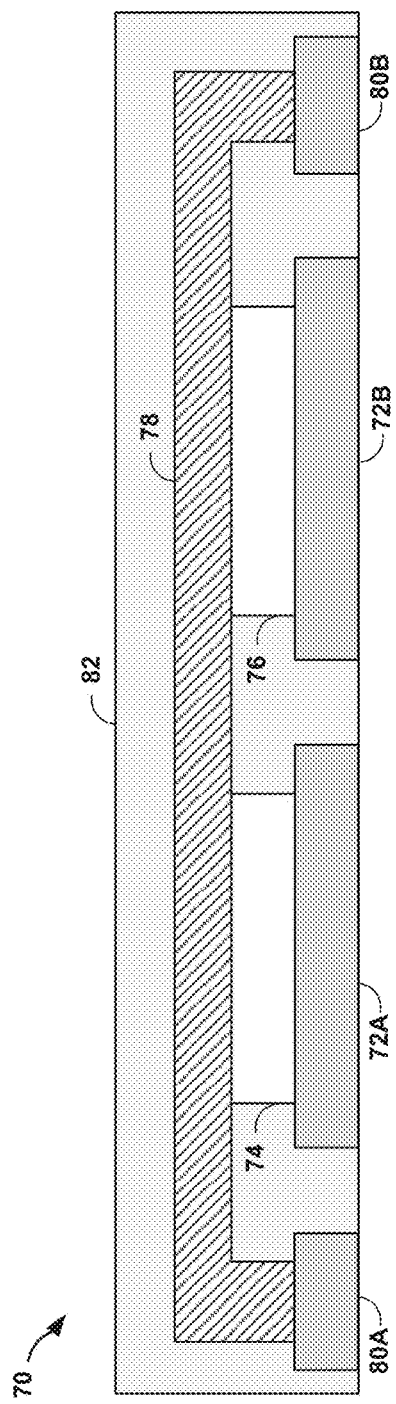
FIG. 7 is a side-view diagram of a device with an encapsulated switching element, in accordance with some examples of this disclosure.

FIG. 7 is a side-view diagram of a device 70 with an encapsulated switching element 78, in accordance with some examples of this disclosure. Device 70 may be encapsulated by molding compound 82, or any other suitable insulating material, to support and electrically insulate the components of device 70. Molding compound 82 may fully encapsulate and cover transistors 74, 76 to prevent electrical conduction between transistors 74, 76 and external components. In some examples, molding compound 82 may fully encapsulate and cover conductive element 78. In some examples, molding compound 82 may partially encapsulate leadframe segments 72A, 72B and switch leadframe segments 80A, 80B to allow for electrical connections to a printed circuit board (PCB). Molding compound 82 may be applied through a process of overmolding. After overmolding, device 70 may be packaged as a power quad flat no-lead (PQFN) package.

Transistors 74, 76 may also be electrically connected to leadframe segments 72A, 72B. Conductive element 78 may be electrically connected to leadframe segments 80A, 80B. Leadframe segments 72A, 72B, 80A, 80B may comprise die paddles, metallization layers, and/or any other suitable conductive material. In some examples, device 70 may include embedded metal layers in addition to or instead of leadframe segments, such as in a high frequency fusion device. The embedded layers may include copper and/or any other suitable conductive material.

In some examples, the electrical connections between transistors 74, 76 and conductive element 78 and between transistors 74, 76 and leadframe segments 72A, 72B may be formed by soldering. The electrical connections between conductive element 78 and leadframe segments 72A, 72B may also be formed by soldering. Soldering components to form electrical connections may include placing solder between the components, applying heat to melt the solder, and allowing the solder to cool to form the electrical connection. The components of device 70 may also be glued or adhered together with conductive paste, conductive tape, conductive epoxy, and/or metal sintering. The connections between transistors 74, 76, leadframe segments 72A, 72B, conductive element 78 may include metalized plated laser vias, solder, and/or high-pressure/high-frequency metalized bonding such as diffusion bonding. Diffusion bonding may include direct bonding between transistors 74, 76, each of which may be a semiconductor die, and leadframe segments 72A, 72B and conductive element 78.

Figure 8:
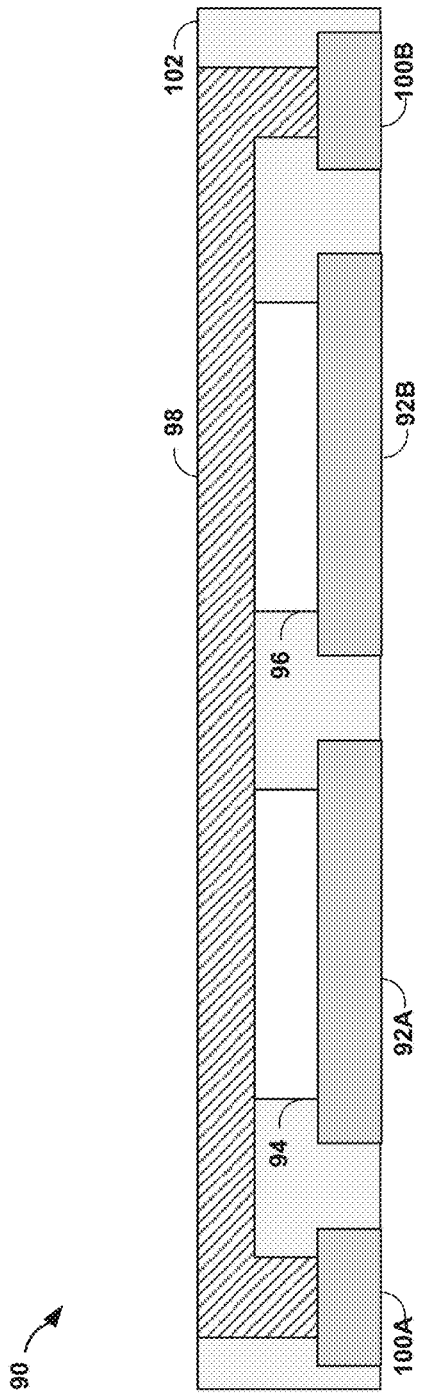
FIG. 8 is a top-view diagram of a device with a partially encapsulated switching element, in accordance with some examples of this disclosure.

FIG. 8 is a top-view diagram of a device 90 with a partially encapsulated switching element 98, in accordance with some examples of this disclosure. Molding compound 102 may fully encapsulate and cover transistors 94, 96. In some examples, molding compound 102 may fully encapsulate and cover conductive element 98. In some examples, partially encapsulating conductive element 98 may allow for improved thermal dissipation of the heat within device 90. The thermal dissipation through a PCB under leadframe segments 92A, 92B, 100A, 100B may not be sufficient to cool device 90 during operation. The thermal dissipation through conductive element 98 may improve the functioning of device 90. By partially exposing conductive element 98, device 90 may allow for electrically connecting external components to conductive element 98.

Figure 9:
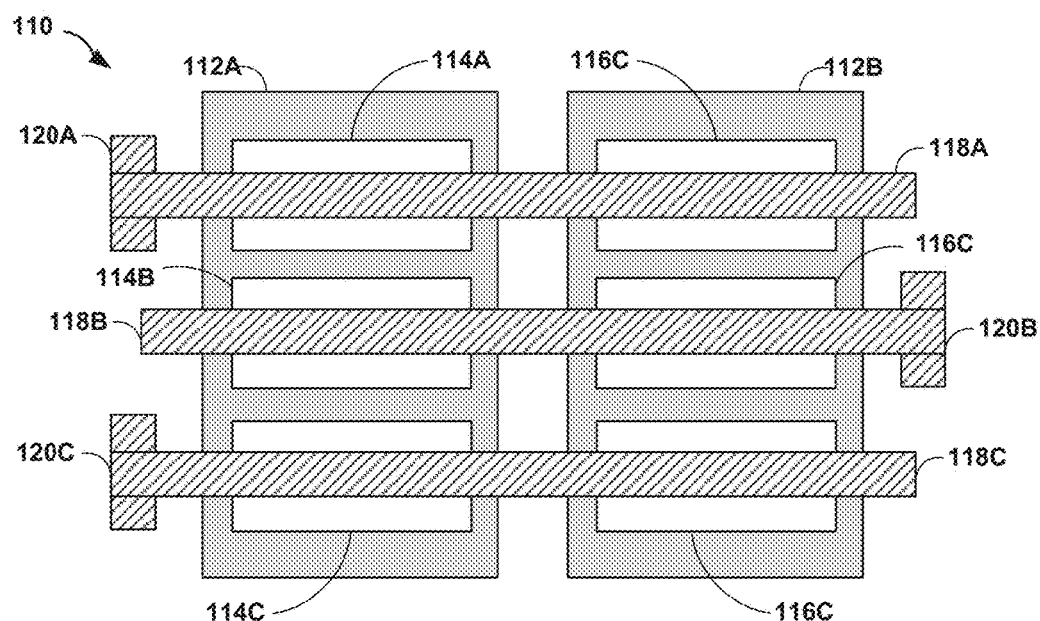
FIG. 9 is a top-view diagram of a device including three switching elements with foot portions, in accordance with some examples of this disclosure.

FIG. 9 is a top-view diagram of a device 110 including three switching elements 118A-118C with foot portions 120A-120C, in accordance with some examples of this disclosure. Each of switching elements 118A-118C may be electrically connected to a respective one of high-side transistors 114A-114C and a respective one of low-side transistors 116A-116C. Switching elements 118A-118C may be parallel to each of switching elements 118A-118C. A respective one of foot portions 120A-120C may be electrically connected to a respective switch leadframe segment (not depicted in FIG. 9) under each of foot portions 120A-120C. The switch leadframe segments may be electrically connected to output nodes for a multiphase power converter. Foot portion 120A may be adjacent to high-side transistor 114A; foot portion 120B may be adjacent to low-high transistors 116B, and foot portions 120A, 120B may be adjacent to each other. By positioning foot portions 120A, 120B on opposite sides of device 110, switching elements 118A, 118B may be positioned closer together.

Figure 11:
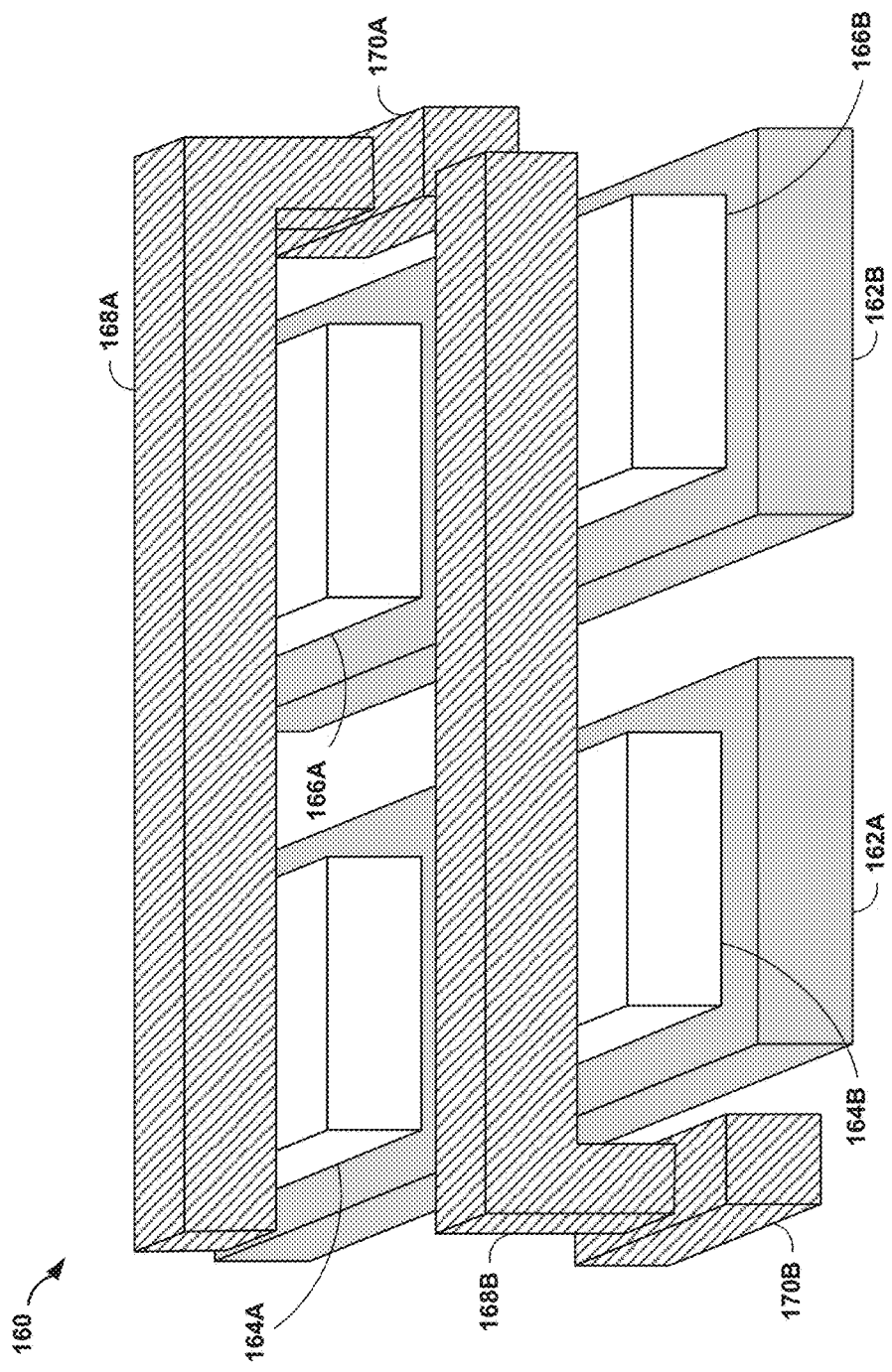
FIG. 11 is a perspective-view diagram of a two-phase device, in accordance with some examples of this disclosure.

Certain shapes of switching elements 118A-118C, including foot portions 120A-120C, may contribute to or prevent shifting of switching elements 118A-118C. Device 110 may function well when switching elements 118A-118C remain in place after manufacture. If switching elements 118A-118C are shaped like straight lines, switching elements 118A-118C may shift or move during assembly and/or installation of device 110. By installing L-shaped switching elements 118A-118C with foot portions 120A-120C that fork into switch leadframe segments (as shown in FIG. 11), switching elements 118A-118C may resist shifting during assembly and/or installation of device 110. Switching elements 118A-118C with a fork shape may assist in keeping the position of switching elements 118A-118C during solder flow.

Figure 10:
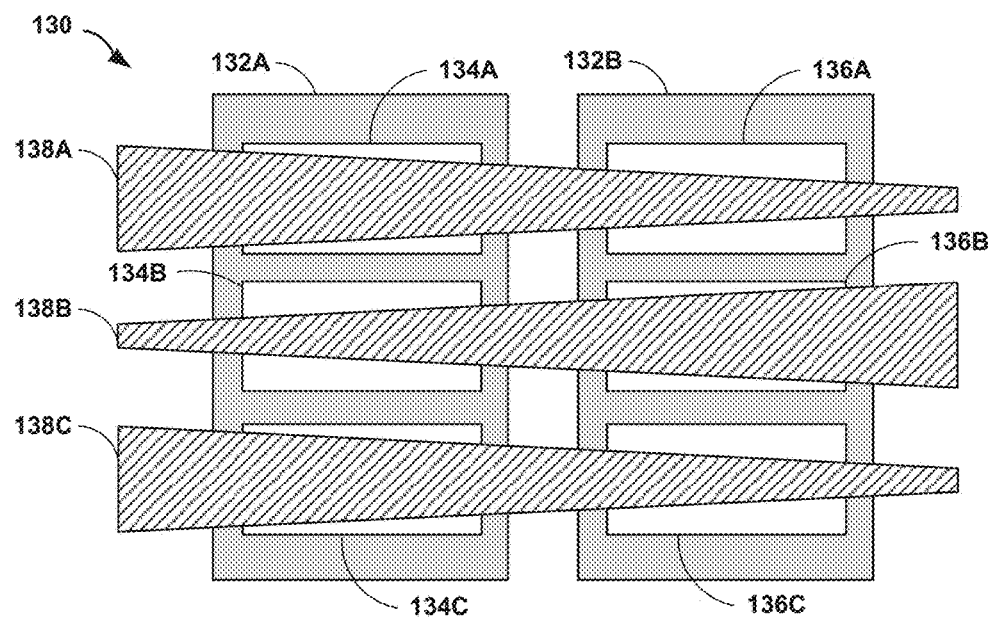
FIG. 10 is a top-view diagram of a device including three switching elements with V-shaped foot portions, in accordance with some examples of this disclosure.

FIG. 10 is a top-view diagram of a device 130 including three switching elements 138A-138C with V-shaped foot portions, in accordance with some examples of this disclosure. Each of switching elements 138A-138C may be electrically connected to a respective one of high-side transistors 134A-134C and a respective one of low-side transistors 136A-136C. The foot portion of switching element 138A may be adjacent to high-side transistor 134A; the foot portion of switching element 138B may be adjacent to low-high transistors 136B, and the foot portions of switching elements 138A, 138B may be adjacent to each other. By positioning the foot portions of switching elements 138A, 138B on opposite sides of device 130, switching elements 138A, 138B may be positioned closer together. The package for device 130 may be more compact, as compared to a device with adjacent foot portions.

FIG. 11 is a perspective-view diagram of a two-phase device 160, in accordance with some examples of this disclosure. Device 160 includes leadframe segments 162A, 162B, transistors 164A, 164B, 166A, 166B, switching elements 168A, 168B, and switch leadframe segments 170A, 170B. The foot portions of switching elements 168A, 168B may be electrically connected to switch leadframe segments 170A, 170B. Switch leadframe segment 170A may be adjacent to transistor 166A, which may be a low-side transistor, and switch leadframe segment 170B may be adjacent to transistor 164B, which may be a high-side transistor. By positioning the foot portions of switching elements 168A, 168B on opposite sides of device 160, switching elements 168A, 168B may be positioned closer together.

Although not depicted in FIG. 11, a control IC (i.e., a driver IC) may be positioned to the side of device 160 and electrically connected to a control terminal of each of transistors 164A, 164B, 166A, 166B. The control IC may send signals to the control terminals of transistors 164A, 164B, 166A, 166B to cause one or more of transistors 164A, 164B, 166A, 166B to conduct electricity between two load terminals (e.g., source and drain).

Figure 12:
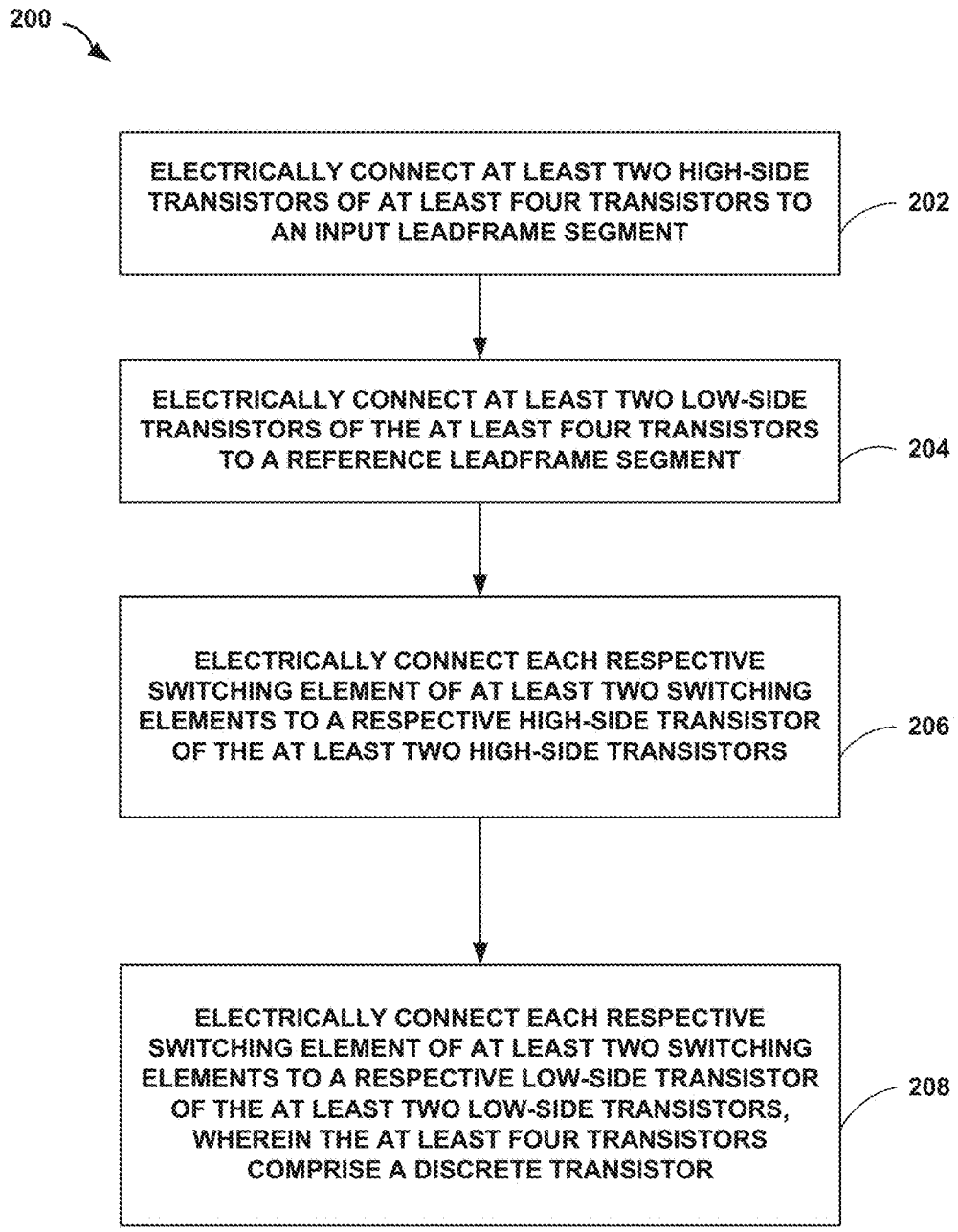
FIG. 12 is a flowchart illustrating an example technique for constructing a multiphase power converter with discrete transistors, in accordance with some examples of this disclosure.

FIG. 12 is a flowchart illustrating an example technique 200 for constructing a multiphase power converter with discrete transistors, in accordance with some examples of this disclosure. Technique 200 is described with reference to device 160 in FIG. 11, although other components, such as devices 40, 50, 60, 110, 130 in FIGS. 4-6, 9, and 10, may exemplify similar techniques.

The technique of FIG. 12 includes electrically connecting at least two high-side transistors 164A, 164B of at least four transistors 164A, 164B, 166A, 166B to an input leadframe segment 162A (202). The drain terminals of high-side transistors 164A, 164B may be electrically to input leadframe segment 162A. Input leadframe segment 162A may be electrically connected to an input voltage, such as a high-side voltage rail.

The technique of FIG. 12 further includes electrically connecting at least two low-side transistors 166A, 166B of the at least four transistors 164A, 164B, 166A, 166B to a reference leadframe segment 162B (204). The source terminals of low-side transistors 166A, 166B may be electrically to reference leadframe segment 162B. Reference leadframe segment 162B may be electrically connected to a reference voltage, such as a low-side voltage rail.

The technique of FIG. 12 further includes electrically connecting each respective switching element of at least two switching elements 168A, 168B to a respective high-side transistor of the at least two high-side transistors 164A, 164B (206). The source terminals of each of high-side transistors 164A, 164B may be electrically to a respective one of switching elements 168A, 168B. When high-side transistors 164A, 164B are switched on by a control signal, switching elements 168A, 168B may be electrically connected to input leadframe segment 162A.

The technique of FIG. 12 further includes electrically connecting each respective switching element of at least two switching elements 168A, 168B to a respective low-side transistor of the at least two low-side transistors 166A, 166B (208). The drain terminals of each of low-side transistors 166A, 166B may be electrically to a respective one of switching elements 168A, 168B. When low-side transistors 166A, 166B are switched on by a control signal, switching elements 168A, 168B may be electrically connected to reference leadframe segment 162B.

Transistors 164A, 164B, 166A, 166B include at least one discrete transistor. In the example depicted in FIG. 11, each of transistors 164A, 164B, 166A, 166B is a discrete transistor.

The following numbered examples demonstrate one or more aspects of the disclosure.

EXAMPLE 1

A device includes an input leadframe segment and a reference leadframe segment, wherein the reference leadframe segment is electrically isolated from the input leadframe segment. The device further includes at least four transistors comprising at least two high-side transistors, wherein each high-side transistor of the at least two high-side transistors is electrically connected to the input leadframe segment, and at least two low-side transistors, wherein each low-side transistor of the at least two low-side transistors is electrically connected to the reference leadframe segment. The device further includes at least two switching elements, wherein each switching element of the at least two switching elements is electrically connected to a respective high-side transistor of the at least two high-side transistors, each switching element of the at least two switching elements is electrically connected to a respective low-side transistor of the at least two low-side transistors, and the at least four transistors include at least one discrete transistor.

EXAMPLE 2

The device of example 1, wherein the at least two high-side transistors comprise at least two discrete transistors; and the at least two low-side transistors comprise at least two discrete transistors.

EXAMPLE 3

The device of any combination of examples 1-2, wherein each transistor of the at least four transistors comprises a discrete transistor.

EXAMPLE 4

The device of any combination of examples 1-3, further including a molding compound, wherein the molding compound encapsulates the at least four transistors; and the molding compound at least partially encapsulates the at least two switching elements.

EXAMPLE 5

The device of any combination of examples 1-4, wherein each switching element of the at least two switching elements comprises an aluminum ribbon, a copper clip, or a wire bond.

EXAMPLE 6

The device of any combination of examples 1-5, further including at least two switch leadframe segments, wherein each switching element of the at least two switching elements comprises a copper clip electrically connected to a respective high-side transistor of the at least two high-side transistors, and a respective low-side transistor of the at least two low-side transistors. Each switching element of the at least two switching elements further comprises a foot portion electrically connected to a respective switch leadframe segment of the at least two switch leadframe segments.

EXAMPLE 7

The device of any combination of examples 1-6, wherein a first foot portion of a first switching element of the at least two switching elements is adjacent to a respective high-side transistor of the at least two high-side transistors; a second foot portion of a second switching element of the at least two switching elements is adjacent to a respective low-side transistor of the at least two low-side transistors; and the first switching element is adjacent to the second switching element.

EXAMPLE 8

The device of any combination of examples 1-7, wherein each high-side transistor of the at least two high-side transistors comprises a vertical high-side field-effect transistor (FET), each low-side transistor of the at least two low-side transistors comprises a vertical low-side field-effect transistor (FET), a drain terminal of each vertical high-side FET of the at least two high-side transistors is electrically connected to the input leadframe segment, a source terminal of each vertical high-side FET of the at least two high-side transistors is electrically connected to a respective switching element of the at least two switching elements, a drain terminal of each vertical low-side FET of the at least two low-side transistors is electrically connected to a respective switching element of the at least two switching elements, and a source terminal of each vertical low-side FET of the at least two low-side transistors is electrically connected to the reference leadframe segment.

EXAMPLE 9

A method including electrically connecting at least two high-side transistors of at least four transistors to an input leadframe segment and electrically connecting at least two low-side transistors of the at least four transistors to a reference leadframe segment, wherein the reference leadframe segment is electrically isolated from the input leadframe segment. The method further includes electrically connecting each respective switching element of at least two switching elements to a respective high-side transistor of the at least two high-side transistors. The method further includes electrically connecting each respective switching element of at least two switching elements to a respective low-side transistor of the at least two low-side transistors, wherein the at least four transistors include at least one discrete transistor.

EXAMPLE 10

The method of example 9, wherein each transistor of the at least four transistors comprises a discrete transistor.

EXAMPLE 11

The method of any combination of examples 9-10, further including testing a performance of the discrete transistor before electrically connecting the discrete transistor to the input leadframe segment or the reference leadframe segment, and discarding the discrete transistor based on testing the performance of the discrete transistor.

EXAMPLE 12

The method of any combination of examples 9-11, further including encapsulating the at least two high-side transistors and the at least two low-side transistors in a molding compound; and at least partially encapsulating the at least two switching elements in the molding compound.

EXAMPLE 13

The method of any combination of examples 9-12, wherein each switching element of the at least two switching elements comprises an aluminum ribbon, a copper clip, or a wire bond.

EXAMPLE 14

The method of any combination of examples 9-13, further including electrically connecting a foot portion of each switching element of the at least two switching elements to a respective switch leadframe segment of at least two switch leadframe segments.

EXAMPLE 15

The method of example 14, wherein electrically connecting a first foot portion of a first switching element of the at least two switching elements to a first respective switch leadframe segment of the at least two switch leadframe segments, and wherein electrically connecting a second foot portion of a second switching element of the at least two switching elements to a second respective switch leadframe segment of the at least two switch leadframe segments. Furthermore, the first switch leadframe segment is adjacent to a respective high-side transistor of the at least two high-side transistors, the second switch leadframe segment is adjacent to a respective low-side transistor of the at least two low-side transistors, and the first switching element is adjacent to the second switching element.

EXAMPLE 16

A multiphase power converter includes an input leadframe segment and a reference leadframe segment, wherein the reference leadframe segment is electrically isolated from the input leadframe segment. The multiphase power converter further includes at least four vertical transistors comprising at least two high-side vertical transistors, wherein each high-side vertical transistor of the at least two high-side vertical transistors is electrically connected to the input leadframe segment, and at least two low-side vertical transistors, wherein each low-side vertical transistor of the at least two low-side transistors is electrically connected to the reference leadframe segment. The multiphase power converter further includes at least two switching elements, wherein each switching element of the at least two switching elements is electrically connected to a respective high-side vertical transistor of the at least two high-side vertical transistors, each switching element of the at least two switching elements is electrically connected to a respective low-side vertical transistor of the at least two low-side vertical transistors, and each vertical transistor of the at least four vertical transistors comprises a discrete vertical transistor.

EXAMPLE 17

The multiphase power converter of example 16, wherein each vertical high-side transistor of the at least two vertical high-side transistors comprises a vertical high-side field-effect transistor (FET), each vertical low-side transistor of the at least two vertical low-side transistors comprises a vertical low-side FET, a drain terminal of each vertical high-side FET of the at least two vertical high-side transistors is electrically connected to the input leadframe segment, a source terminal of each vertical high-side FET of the at least two vertical high-side transistors is electrically connected to a respective switching element of the at least two switching elements, a drain terminal of each vertical low-side FET of the at least two vertical low-side transistors is electrically connected to a respective switching element of the at least two switching elements, and a source terminal of each vertical low-side FET of the at least two vertical low-side transistors is electrically connected to the reference leadframe segment.

EXAMPLE 18

The multiphase power converter of any combination of examples 16-17, further comprising at least two switch leadframe segments, wherein each switching element of the at least two switching elements comprises a copper clip and a foot portion electrically connected to a respective switch leadframe segment of the at least two switch leadframe segments.

EXAMPLE 19

The multiphase power converter of any combination of examples 16-18, wherein a first foot portion of a first switching element of the at least two switching elements is adjacent to a respective high-side vertical transistor of the at least two high-side vertical transistors, a second foot portion of a second switching element of the at least two switching elements is adjacent to a respective low-side vertical transistor of the at least two low-side vertical transistors, and the first switching element is adjacent to the second switching element.

EXAMPLE 20

The multiphase power converter of any combination of examples 16-19, further comprising a molding compound, wherein the molding compound encapsulates the at least four vertical transistors, and the molding compound at least partially encapsulates the at least two switching elements.

Various examples of the disclosure have been described. Any combination of the described systems, operations, or functions is contemplated. These and other examples are within the scope of the following claims.

What is claimed is:
1. A device comprising:
an input leadframe segment;
a reference leadframe segment, wherein the reference leadframe segment is electrically isolated from the input leadframe segment;
at least four transistors comprising:
at least two high-side transistors, wherein each high-side transistor of the at least two high-side transistors is electrically connected to the input leadframe segment, and
at least two low-side transistors, wherein each low-side transistor of the at least two low-side transistors is electrically connected to the reference leadframe segment; and
at least two switching elements, wherein:
each switching element of the at least two switching elements is electrically connected to a respective high-side transistor of the at least two high-side transistors,
each switching element of the at least two switching elements is electrically connected to a respective low-side transistor of the at least two low-side transistors, and
the at least four transistors include at least one discrete transistor, wherein the at least one discrete transistor is not integrated into a single semiconductor die with another transistor.

2. The device of claim 1, wherein:
the at least two high-side transistors comprise at least two discrete transistors; and
the at least two low-side transistors comprise at least two discrete transistors.

3. The device of claim 1, wherein each transistor of the at least four transistors comprises a discrete transistor.

4. The device of claim 1, further comprising a molding compound, wherein:
the molding compound encapsulates the at least four transistors; and
the molding compound at least partially encapsulates the at least two switching elements.

5. The device of claim 1, wherein each switching element of the at least two switching elements comprises an aluminum ribbon, a copper clip, or a wire bond.

6. The device of claim 1, further comprising at least two switch leadframe segments, wherein each switching element of the at least two switching elements comprises:
a copper clip electrically connected to:
a respective high-side transistor of the at least two high-side transistors, and
a respective low-side transistor of the at least two low-side transistors; and
a foot portion electrically connected to a respective switch leadframe segment of the at least two switch leadframe segments.

7. The device of claim 1, wherein:
a first foot portion of a first switching element of the at least two switching elements is adjacent to a respective high-side transistor of the at least two high-side transistors;
a second foot portion of a second switching element of the at least two switching elements is adjacent to a respective low-side transistor of the at least two low-side transistors; and
the first switching element is adjacent to the second switching element.

8. The device of claim 1, wherein:
each high-side transistor of the at least two high-side transistors comprises a vertical high-side field-effect transistor (FET);

each low-side transistor of the at least two low-side transistors comprises a vertical low-side field-effect transistor (FET);
a drain terminal of each vertical high-side FET of the at least two high-side transistors is electrically connected to the input leadframe segment;
a source terminal of each vertical high-side FET of the at least two high-side transistors is electrically connected to a respective switching element of the at least two switching elements;
a drain terminal of each vertical low-side FET of the at least two low-side transistors is electrically connected to a respective switching element of the at least two switching elements; and
a source terminal of each vertical low-side FET of the at least two low-side transistors is electrically connected to the reference leadframe segment.

9. A method comprising:
electrically connecting at least two high-side transistors of at least four transistors to an input leadframe segment;
electrically connecting at least two low-side transistors of the at least four transistors to a reference leadframe segment, wherein the reference leadframe segment is electrically isolated from the input leadframe segment;
electrically connecting each respective switching element of at least two switching elements to a respective high-side transistor of the at least two high-side transistors; and
electrically connecting each respective switching element of at least two switching elements to a respective low-side transistor of the at least two low-side transistors, wherein the at least four transistors include at least one discrete transistor, wherein the at least one discrete transistor is not integrated into a single semiconductor die with another transistor.

10. The method of claim 9, wherein each transistor of the at least four transistors comprises a discrete transistor.

11. The method of claim 9, further comprising:
testing a performance of the at least one discrete transistor before electrically connecting the discrete transistor to the input leadframe segment or the reference leadframe segment; and
discarding the discrete transistor based on testing the performance of the discrete transistor.

12. The method of claim 9, further comprising:
encapsulating the at least two high-side transistors and the at least two low-side transistors in a molding compound; and
at least partially encapsulating the at least two switching elements in the molding compound.

13. The method of claim 9, wherein each switching element of the at least two switching elements comprises an aluminum ribbon, a copper clip, or a wire bond.

14. The method of claim 9, further comprising electrically connecting a foot portion of each switching element of the at least two switching elements to a respective switch leadframe segment of at least two switch leadframe segments.

15. The method of claim 14, wherein:
electrically connecting a first foot portion of a first switching element of the at least two switching elements to a first respective switch leadframe segment of the at least two switch leadframe segments; and
electrically connecting a second foot portion of a second switching element of the at least two switching elements to a second respective switch leadframe segment of the at least two switch leadframe segments, wherein:

the first switch leadframe segment is adjacent to a respective high-side transistor of the at least two high-side transistors,
the second switch leadframe segment is adjacent to a respective low-side transistor of the at least two low-side transistors, and
the first switching element is adjacent to the second switching element.

16. A multiphase power converter comprising:
an input leadframe segment;
a reference leadframe segment, wherein the reference leadframe segment is electrically isolated from the input leadframe segment;
at least four vertical transistors comprising:
at least two high-side vertical transistors, wherein each high-side vertical transistor of the at least two high-side vertical transistors is electrically connected to the input leadframe segment, and
at least two low-side vertical transistors, wherein each low-side vertical transistor of the at least two low-side vertical transistors is electrically connected to the reference leadframe segment; and
at least two switching elements, wherein:
each switching element of the at least two switching elements is electrically connected to a respective high-side vertical transistor of the at least two high-side vertical transistors,
each switching element of the at least two switching elements is electrically connected to a respective low-side vertical transistor of the at least two low-side vertical transistors, and
each vertical transistor of the at least four vertical transistors comprises a discrete vertical transistor that is not integrated into a single semiconductor die with another transistor.

17. The multiphase power converter of claim 16, wherein:
each vertical high-side transistor of the at least two vertical high-side transistors comprises a vertical high-side field-effect transistor (FET);
each vertical low-side transistor of the at least two vertical low-side transistors comprises a vertical low-side FET;
a drain terminal of each vertical high-side FET of the at least two vertical high-side transistors is electrically connected to the input leadframe segment;
a source terminal of each vertical high-side FET of the at least two vertical high-side transistors is electrically connected to a respective switching element of the at least two switching elements;
a drain terminal of each vertical low-side FET of the at least two vertical low-side transistors is electrically connected to a respective switching element of the at least two switching elements; and
a source terminal of each vertical low-side FET of the at least two vertical low-side transistors is electrically connected to the reference leadframe segment.

18. The multiphase power converter of claim 16, further comprising at least two switch leadframe segments, wherein each switching element of the at least two switching elements comprises:
a copper clip; and
a foot portion electrically connected to a respective switch leadframe segment of the at least two switch leadframe segments.

19. The multiphase power converter of claim 16, wherein:
a first foot portion of a first switching element of the at least two switching elements is adjacent to a respective high-side vertical transistor of the at least two high-side vertical transistors;
a second foot portion of a second switching element of the at least two switching elements is adjacent to a respective low-side vertical transistor of the at least two low-side vertical transistors; and
the first switching element is adjacent to the second switching element.

20. The multiphase power converter of claim 16, further comprising a molding compound, wherein:
the molding compound encapsulates the at least four vertical transistors, and
the molding compound at least partially encapsulates the at least two switching elements.

\* \* \* \* \*